United States Patent [19]
Guzinski

[11] Patent Number: 5,481,580
[45] Date of Patent: Jan. 2, 1996

[54] METHOD AND APPARATUS FOR TESTING LONG COUNTERS

[75] Inventor: Miroslaw Guzinski, Lawrenceville, N.J.

[73] Assignee: AT&T Corp., Murray Hill, N.J.

[21] Appl. No.: 378,435

[22] Filed: Jan. 26, 1995

[51] Int. Cl.⁶ .................................................. H03K 21/40
[52] U.S. Cl. .................................................. 377/29
[58] Field of Search ...................................... 377/28, 29

[56] References Cited

U.S. PATENT DOCUMENTS

| | | | |
|---|---|---|---|
| 3,613,014 | 10/1971 | Moegen | 377/29 |
| 4,336,448 | 6/1982 | Shipp et al. | 377/29 |
| 4,373,201 | 2/1983 | Bohan | 377/29 |
| 4,745,630 | 5/1988 | Underwood | 377/29 |
| 4,860,325 | 8/1989 | Aria et al. | 377/29 |
| 4,979,193 | 12/1990 | Mehta | 377/29 |
| 4,991,185 | 2/1991 | Hatten et al. | 377/29 |
| 5,339,343 | 8/1994 | Hashimoto | 377/29 |
| 5,381,453 | 1/1995 | Chan | 377/29 |

*Primary Examiner*—John S. Heyman
*Attorney, Agent, or Firm*—Robert B. Levy

[57] ABSTRACT

An n-bit counter (18) (where n is an integer≧1) may be tested by first reconfiguring the counter during a test mode to generate successive first and second half-counts when the counter is successively clocked. During the test mode, a logical equality comparator (70) compares the half-counts to each other. When the half-counts are unequal (signifying a counter fault), the counter is inhibited from further counting. In this way, the counter is advantageously frozen at the faulty value. When the counter is inhibited from counting, its carry bit (CO) no longer toggles. Thus, by examining the counter carry bit, an indication can be had whether the counter is operating properly during the test mode.

6 Claims, 4 Drawing Sheets

METHOD AND APPARATUS FOR TESTING LONG COUNTERS

TECHNICAL FIELD

This invention relates to a method and apparatus for testing long (i.e., multi-bit) counters.

BACKGROUND ART

Digital counters are well-known electronic devices that provide an n-bit count that runs between $2^n-1$ and 0. For such a counter to function properly, the counter must be capable of accurately counting down from $2^n-1$ to zero or up from zero to $2^n-1$, depending on whether the counter is of the count-down or count-up variety, respectively. To properly test a counter, each of its counts must be verified. One past testing approach has been to clock the counter and then compare each count to an expected count generated by a reference counter. This approach incurs the disadvantage that a reference counter of equal length is required to generate a reference count for comparison purposes. The need for a reference counter increases the overhead of the circuit in the event that the reference counter is incorporated to accomplish Built-In Self-Testing.

Thus, there is a need for a technique for more efficiently testing a large counter.

BRIEF SUMMARY OF THE INVENTION

Briefly, in accordance with the invention, a method is provided for testing an n-bit counter (where n is an integer $\geq 1$) that provides a count that runs between $2^n-1$ and 0 and that may be reconfigured to provide first and second equal half-counts, each running between 0 and one-half of the normal counter count when n is even. When the counter is reconfigured, each half-count equals the other, provided that the counter is operating properly. The method of the invention is initiated by first resetting the counter to an initial prescribed value V such that $0 \leq V \leq 2^n-1$. Thereafter, the counter is reconfigured to generate its first and second half-counts. Next, the counter is clocked repeatedly so the half-counts change monotonically upon each rising edge of the clock signal. In the case of a down counter, the counter counts down from the initial value to zero. Conversely, in the case of an up-counter, the counter counts up from zero to the initial value. Each time the counter is clocked, the first and second half-counts are compared to each other. When the counter has been reconfigured, as occurs during testing, the half-counts will be equal to each other unless the counter is faulty. If the half-counts are unequal, then an error has occurred and, the counter is inhibited from further counting during testing. In this way, the counter is effectively frozen at the faulty count. As long as the counter half-counts are equal to each other, the counter continues to count until the counter has counted out, thus generating a carry bit. The counter may then be reloaded, and the process resumed. Under these conditions, a properly functioning counter will generate a steady stream of carry bits.

When n is even, then comparison of the counter half-counts is sufficient to detect a faulty counter. However, when n is odd, the counter may still incur an error even when the half-counts are equal because there will be one remaining bit (for example, the lowest order bit of the count) unchecked by such a comparison. Thus, when n is odd, it is desirable to check to see whether the remaining bit not comprising either of the half-counts toggles upon each rising edge of a clock signal, in addition to comparing the half-counts to each other.

The above method more efficiently tests a long counter by comparing its half-counts to each other. In this way, the need for a long reference counter is obviated, thereby yielding a lower circuit overhead, a lower pin count and enhanced testability (higher fault coverage and faster test execution).

DETAILED DESCRIPTION

Figure 1:
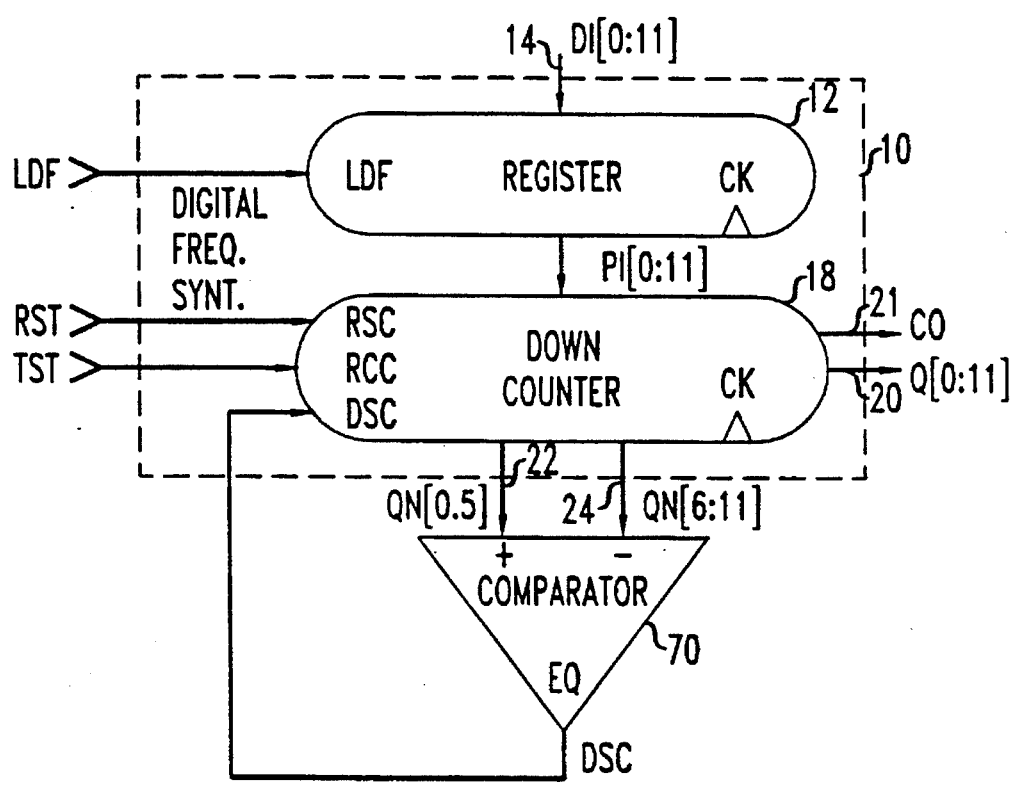
FIG. 1 is a block schematic diagram of a frequency synthesizer containing a long counter that is tested in accordance with the invention.

FIG. 1 illustrates a block schematic diagram of a digital frequency synthesizer 10 comprising an n-bit register 12, where n is an integer $\geq 1$. In the illustrated embodiment, n is twelve although it should be understood that n can be larger or smaller as required. The register 12 stores an twelve-bit data word DI[0, 11] that is supplied to the register on an input data bus 14 from an external source (not shown). In response to a Load Frequency command (LDF) received by the register 12 on a line 15, the register outputs the stored data word DI[0, 11] on an output bus 16 for input to a twelve-bit counter 18 as a Parallel Input load value PI[0, 11].

In the illustrated embodiment, the counter 18 comprises a down counter that decrements the load value PI[0, 11] upon each rising edge of a periodic clock signal applied to the counter at its clock input CK to yield an a count Q[0, 11] on a counter output bus 20. After the counter 18 has completely decremented the load value PI[0, 11], the counter generates a logic high level carry bit CO on its carry output 21 upon the next rising edge of the clock signal. The carry bit corresponds to the condition when the count Q[0, 11] is all zeros, and thus the carry bit may sometimes be referred to as a zero detect bit. If the counter clock signal has a frequency fo, then the carry rises to a logic high level at a frequency of fo/n. In this way, the frequency synthesizer 10 effectively synthesize a fraction of the frequency of the clock signal fo.

In the past, the counter 18 has been tested by comparing its monotonically decreasing count on its output bus 20 to a monotonically decreasing count of a reference counter (not shown) that is clocked simultaneously with the counter 18 If any count of the counter 18 fails to match the corresponding reference count, then the counter is faulty. While this method of testing the counter 18 is effective, it is inefficient from the standpoint of requiring a separate n-bit reference counter.

In accordance with the invention, the counter 18 can be tested more efficiently by first choosing the counter to be reconfigurable. While the counter 18 operates in its reconfigured mode, as will be described in greater detail hereinafter, the counter generates two half-counts $QN_L$ and $QN_H$ that appear on buses 22 and 24, respectively. The halfcounts $QN_L$ and $QN_H$ correspond to the inverted lower order and upper order bits, respectively, of the count Q[0, 11] and are identical to each other when the counter 18 is functioning properly. When n is odd, the half-counts $QN_L$ and $QN_H$ have equal numbers of bits as they do when n is even. Also, when n is odd, the counter generates a remainder bit (not shown), for example, the lowest order bit of the count. The remainder bit will thus toggle upon each rising edge of the counter clock signal during testing.

Figure 2:
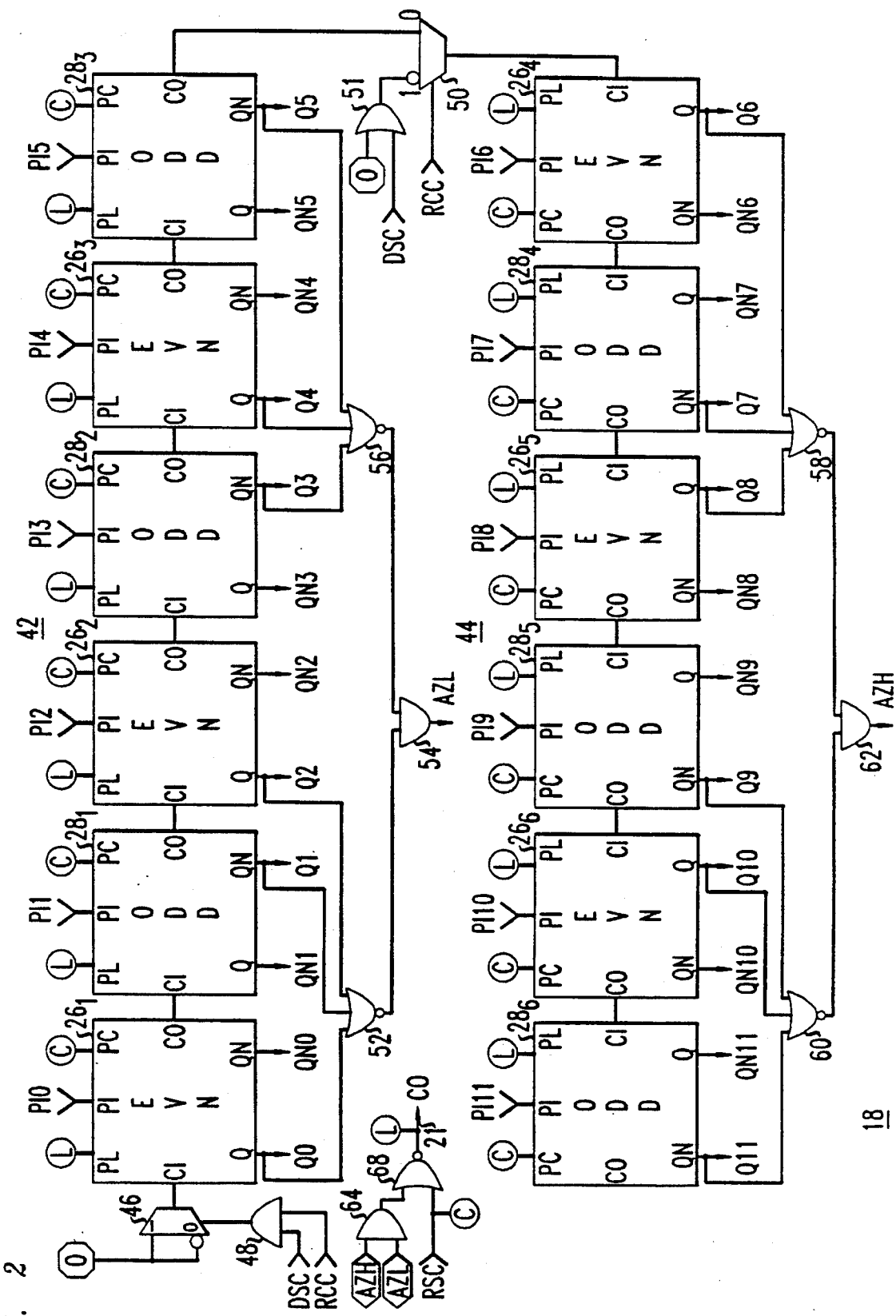
FIG. 2 is a block schematic diagram of the counter of FIG. 1.
Figure 3:
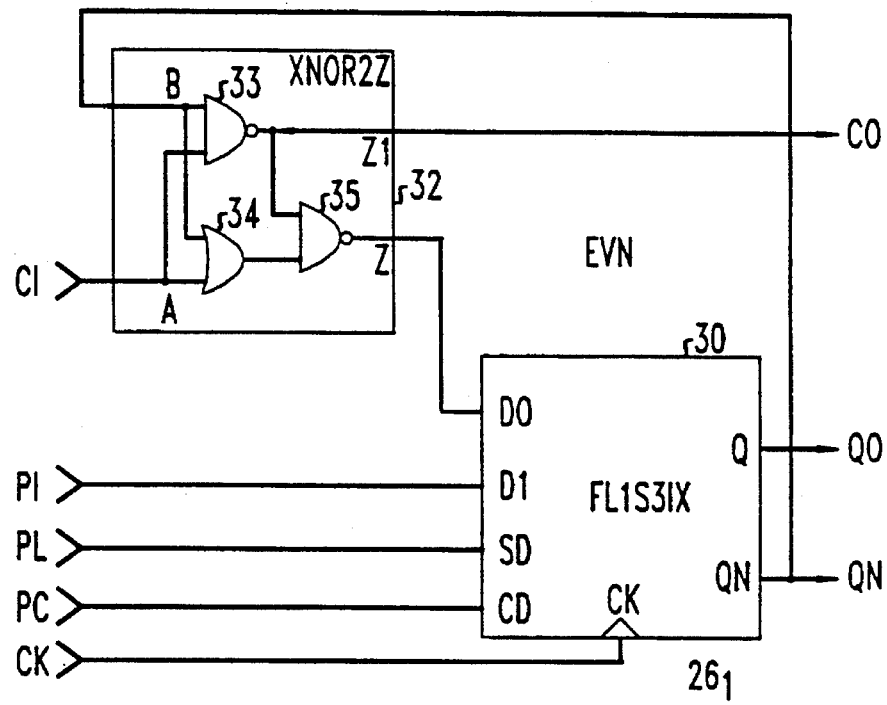
FIG. 3 is a block schematic diagram of an even counter stage comprising part of the counter of FIG. 2.

Referring to FIG. 2, there is shown a block schematic diagram of an exemplary twelve-bit reconfigurable counter 18. As illustrated, the counter 18 comprises six even counter stages $26_1$–$26_6$, each designated by the term "EVN" and six odd counter stages $28_1$–$28_6$, each designated by the term "ODD". The even counter stages $26_1$–$26_6$ are identical to each other so that only the stage $26_1$ will be described in detail. Referring now to FIG. 3, the counter stage $26_1$ comprises a D-type flip-flop 30 that has first and second data inputs D0 and D1 that are selectable in accordance with the logic level of a signal applied to the flip-flop at its Select Data (SD) input. The logic level of the signal at the selected one of the data inputs D0 and D1 sets the logic level of the output signal that is produced at the Q output of the flip-flop 30 upon the rising edge of a clock signal CK at the flip-flop clock input CK that is coupled to the clock input of the counter 18. The state of the signal at the selected data input sets the signal at the Q flip-flop output and sets a complementary value at the QN output upon the rising edge of the flip-flop clock signal CK.

The flip-flop 30 has a Clear Data (CD) input. When the CD input is supplied with a logic high level signal, the flip-flop 30 clears itself by forcing the signals at the flip-flop Q and QN outputs to logic low and logic high levels, respectively. In the illustrated embodiment, the flip-flop 30 comprises a model FL1S3IX flip-flop available in the CMOS standard cell design library of AT&T Microelectronics, Allentown, Pa.

The input D1 of the flip-flop 30 is provided with a Parallel Input signal PI corresponding to an individual one of the bits of the Parallel Input load value PI[0, 11] for the particular counter stage. (Thus, for example, the stage $26_1$ receives the bit PI[0] of the load value PI[0, 11].) The flip-flop inputs SD and CD are provided with an external Positive Load (PL) signal and a Positive Clear (PC) signal, respectively. The signals PL and PC rise to a logic high level when the counter 18 is loaded and when the counter is cleared, respectively. The D0 input to the flip-flop 30 of FIG. 3 is provided with a signal produced at the output (Z) of an exclusive NOR (XNOR) gate circuit 32 having a pair of inputs A and B. The input A receives a Carry-In signal (CI) while the input B receives the QN output signal of the flip-flop 30.

In the illustrated embodiment, the gate circuit 32 comprises a model XNOR2Z gate available in the CMOS Standard Cell Library of AT&T Microelectronics. This particular gate circuit 32 comprises a first two-input NAND gate 33 that receives the input signals A and B at its first and second inputs, respectively. The gate 33 provides an output signal Z1 in accordance with the logical relationship.

$$Z1 = \overline{(AB)} \tag{1}$$

The gate circuit 32 also includes a two-input OR gate 34 that is supplied at its first and second inputs with the input signals A and B, respectively. Additionally, the gate circuit 32 includes a second two-input NAND gate 35 that NANDs the output signals of the gates 33 and 34 to yield the exclusive-NOR output signal (Z) of the gate circuit in accordance with the relationship:

$$Z = \overline{(A+B)(\overline{AB})} \tag{2}$$

As may now be appreciated, the gate circuit 32 thus provides output signal Z1 representing the NAND of the signals at the inputs A and B while the output signal Z, represents the exclusive-NOR of the signals at these inputs. The output signal Z1 of the gate circuit 32 advantageously serves as the Carry-Out signal (CO) of the stage $26_1$.

Figure 6:
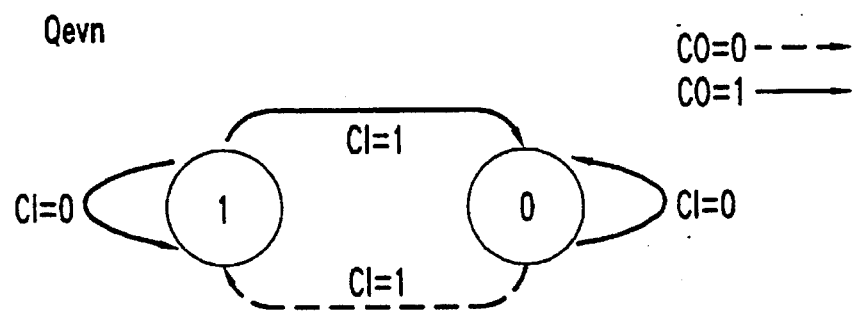
FIG. 6 is a state diagram of a non-invert output bit (Q) generated by the even counter stage of FIG. 3.

The signal CO is active low and indicates whether the counter stage $26_1$ has toggled twice. This may best be understood by reference to FIG. 6 which is a state diagram of the Q output bit (designated in the Figure as Qeven) of the counter stage $26_1$ of FIG. 3. As seen in FIG. 6, while the signal CI to the counter stage $26_1$ is at a logic low level, then the Q output bit (Qeven) of the counter stage remains at its previous logical state (either a logic low or logic high level, as indicated by the self-looping arrows at the left and right-hand edges of FIG. 6). However, while the input signal CI to the counter stage is at a logic high level, then the output signal Q (Qeven in FIG. 6) will toggle between a logic high level ("1") and a logic low level ("0") upon each rising clock edge. The signal CO produced by the counter stage $26_1$ will always be at a logical high level except when the Q output signal (Qeven) transitions from "0" to "1", indicating a second toggling of the counter stage $26_1$.

Figure 4:
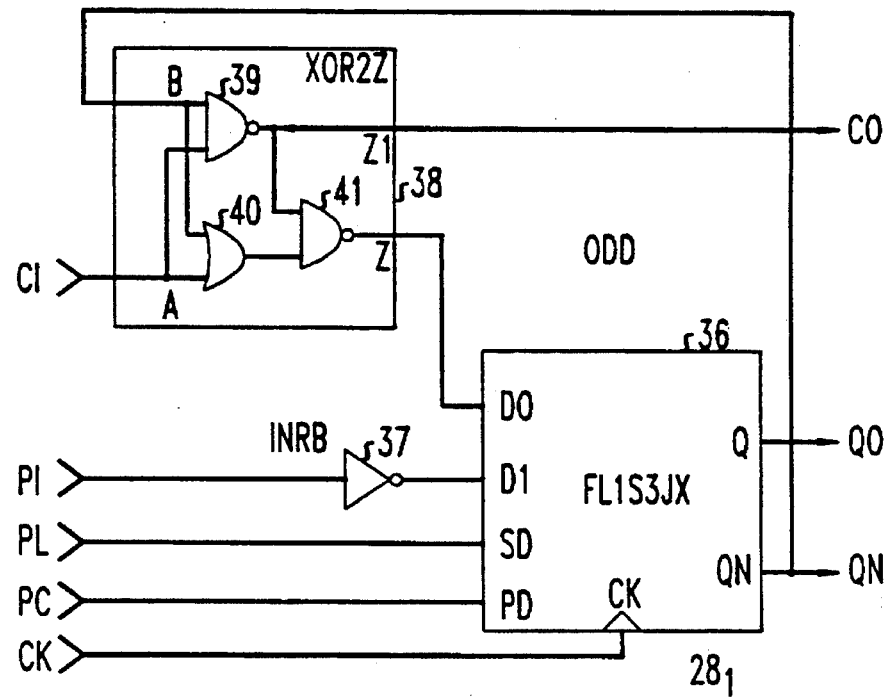
FIG. 4 is a block schematic diagram of an odd counter stage comprising part of the counter of FIG. 2.

The counter stages $28_1$–$28_6$ of FIG. 2 are identical to each other. Therefore, only the counter stage $28_1$ will be described in detail. Referring to FIG. 4, the odd counter stage $28_1$ comprises a D-type flip-flop 36. Like the flip-flop 30 of FIG. 3, the flip-flop 36 of FIG. 4 has a pair of data inputs D0 and D1 that are selectable in accordance with the state of the signal PL supplied to the flip-flop at its SD input. The flip-flop 36 has a clock-input CK that is coupled to the clock input of the counter 18 for receiving the same periodic clock signal that is supplied to the even counter stage $26_1$ of FIG. 3.

The flip-flop 36 of FIG. 4 differs from the flip-flop 30 of FIG. 3 in one major respect. As discussed, the flip-flop 30 of FIG. 3 has a clear input CD which, when supplied with a logic high level signal, causes the flip-flop to clear itself and generate logic low and logic high level Q and QN output signals, respectively. In contrast, the flip-flop 36 of FIG. 4 has a Preset Data (PD) input, which, when supplied with a logic high level signal, causes the flip-flop 36 to set the Q output signal to a logic high level, and conversely, to set the flip-flop QN output signal to a logic low level. The input PD of the flip-flop 36 is supplied with the same signal PC as the input CD of the flip-flop 30 of FIG. 3.

As will become better understood hereinafter, the QN output signal of the flip-flop 36 serves as the output signal of the counter stage $28_1$ whereas the Q output signal of the flip-flop 30 of FIG. 3 serves as the output signal of the counter stage $26_1$. Under these conditions, the signal PC at the PD input of the flip-flop 36 of FIG. 4 effectively clears that flip-flop when the signal PC rises to a logic high level. By the same token, when the PC signal rises to a logic high level, the PC signal clears the flip-flop 30 of FIG. 3.

The flip-flop 36 of FIG. 4 has its data input D1 supplied through an inverter 37 with the signal PI (representing a corresponding bit of the load value PI[0, 11] for this counter stage). The inverter 37 typically comprises a model INRB inverter available in the AT&T Microelectronics CMOS Standard Cell Design Library. The D0 input of the flip-flop 36 is supplied with the output signal Z of an exclusive OR (XOR) gate circuit 38 having a first input A supplied with the signal CI for the counter stage $28_1$ and a second input B supplied with the QN output signal of the flip-flop 36.

In the illustrated embodiment, the XOR gate circuit 39 comprises a model XOR2Z gate available in the CMOS Standard Cell Design Library of AT&T Microelectronics. This type of gate circuit includes a first two-input NOR gate 39 whose inputs are supplied with the input signals A and B, respectively. The NOR gate 39 produces an output signal (Z1) in accordance with the logical relationship:

$$Z1 = \overline{(A+B)} \qquad (3)$$

The gate circuit 39 also includes a two-input AND gate 40 supplied at each of its inputs with the input signals A and B. A second NOR gate 41 within the gate circuit 32 NORs the output signals of the NOR gate 39 and the AND gate 40 to produce exclusive OR output (Z) signal in accordance with the logical relationship:

$$Z = \overline{AB + \overline{(A+B)}} \qquad (4)$$

Figure 7:
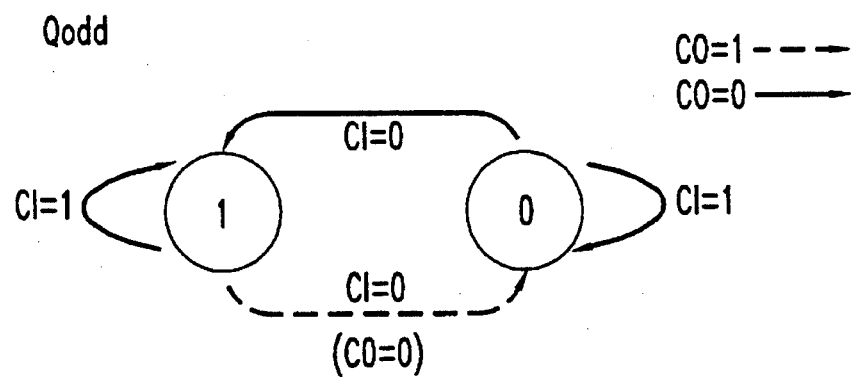
FIG. 7 is a state diagram of a inverted output bit (QN) generated by the odd counter stage of FIG. 4.

The XOR2Z gate circuit 38 provides an output signal Z, representing the exclusive OR of the signals at the inputs A and B while the output signal Z1 represents the NOR of the signals at the inputs A and B. The output signal Z1 of the gate circuit 38 advantageously serves as the Carry-Out signal (CO) for the stage $28_1$. The signal CO is active high and indicates whether the counter stage $28_1$ has toggled twice. This may best be understood by reference to FIG. 7 which is a state diagram of the QN output bit (designated in FIG. 7 as Qodd) of the counter stage $28_1$ of FIG. 4. As seen in FIG. 7, while the signal CI to the counter stage $28_1$ is at a logic high level, then the Q output bit (Qodd) of the counter stage $28_1$ remains at its previous logical state (either a logic low or logic high level, as indicated by the self-looping arrows at the left and right-hand edges of FIG. 7). However, while the input signal CI to the counter stage is at a logic low level, then the output signal QN (Qodd in FIG. 7) will toggle between a logic high level ("1") and a logic low level ("0") upon each rising clock edge. The signal CO produced by the counter stage $28_1$ will always be at a logical low level except when the QN output signal (Qodd) transitions from "1" to "0", indicating a second toggling of the counter stage $28_1$.

Referring to FIG. 2, the counter stages $26_1$–$26_6$ and $28_1$–$28_6$ comprising the counter 18 are arranged in two separate daisy chains 42 and 44. The chain 42 comprises the even counter stages $26_1$–$26_3$ and the odd counter stages $28_1$–$28_3$ arranged in alternating fashion so that each successive one of the even stages $26_1$–$26_3$ supplies its signal CO to a successive one of the odd counter stages $28_1$–$28_3$ for input as the signal CI for each odd stage. In turn, each successive one of the odd counter stages $28_1$–$28_3$ supplies its CO signal to the next successive even stage for input thereto as its CI signal. Thus, for example, the counter stage $26_1$ supplies its signal CO to the counter stage $28_1$ for input thereto as the CI signal for that odd counter stage. In this way, the counter stage $26_1$ sets the input value for counter stage $28_1$ together with the QN value of the latter stage. In turn, the counter stage $28_1$ supplies its signal CO to the counter stage $26_2$ for input thereto as the CI signal for that even stage. In this way, the stage $28_1$ sets the input value for the stage $26_2$ in accordance with the QN signal of that latter stage. As will be discussed, the CO signal generated by the last odd stage $28_3$ of the chain 42 serves as the CI signal for the first even stage $26_4$ of the second chain 44 when the counter 18 operates in its normal (non-reconfigured) mode.

The first even stage $26_1$ of the chain 42 receives its CI from a multiplexer 46 that has a non-invert input and an invert input, both supplied with a continuous low logic level signal. The multiplexer 46 is controlled by the output signal of an AND 48 gate that is supplied at a first input with a Disable Counter signal (DSC), which as will be described, is asserted at a logic high level to disable the counter 18 from counting. (When the counter 18 is to count, the DSC signal remains at a logic low level, so that the signal CI supplied by the multiplexer 46 to the stage $26_1$ remains at a logic high level.) The second input of the AND gate 48 is supplied with a Reconfigure Counter signal (RCC) that controls the reconfiguration of the counter 18. As will be appreciated from a discussion of the operation of the counter 18 provided hereinafter, the multiplexer 46 and the AND gate 48 could be replaced by a single, two-input NAND gate (not shown) supplied with the DSC and RCC signals.

The chain 44 has its counter stages $26_4$–$26_6$ and $28_4$–$28_6$ coupled in the same even-odd fashion as the chain 42. Thus, each successive one of the even stages $26_4$–$26_6$ supplies its CO signal to each successive one of the odd stages $28_4$–$28_6$, respectively, for input thereto as that stage's CI signal. The first even stage $26_4$ of the chain 44 receives its CI signal from the output of a multiplexer 50 having an invert input supplied with the output signal of an OR gate 51 whose first input is supplied with a continuous logic low level signal. The second input of the OR gate 51 is supplied with the same signal DSC that is supplied to the AND gate 48. The multiplexer 50 has a non-invert input supplied with the CO signal from the odd counter stage $28_3$ of the chain 42. The multiplexer 50 is controlled by the signal RCC and passes either the output signal of the OR gate 51, or the CO signal from the counter stage $28_3$, depending on whether the RCC signal is at a logic high or low level, respectively.

Each of the stages $26_1$ and $26_2$ of the chain 42 has its Q output, (designated as Q0, and Q2, respectively), coupled to an individual one of the inputs of a three-input NOR gate 52. The remaining input of the gate 52 is supplied with the QN signal (designated Q1) from the counter stage $28_1$. The NOR gate 52 has its output is coupled to a first input of a two-input AND gate 54. The second input of the AND gate 54 is coupled to the output of a three-input NOR gate 56 two of whose outputs are supplied with the QN output signals (Q3 and Q5) from the counter stages $28_2$ and $28_3$. The remaining input of the gate 56 is supplied Q output signal (Q4) from the counter stage $26_3$.

When coupled to the NOR gates 52 and 56 as described, the AND gate 54 generates an output signal AZL (All Zero Low) at a logic high level when both NOR gates generate a logic high level output signal. This occurs when the output signals Q0, Q1, Q2, Q3, Q4, and Q5 of the counter stages $26_1$, $28_1$, $26_2$, $28_2$, $26_3$, and $28_3$, respectively, are each at a logic low level.

Like the chain 42, the chain 44 includes a first three-input NOR gate 58 for NORing the Q output signals (Q6, and Q8) of the stages $26_4$, and $26_5$, with the QN signal (Q7) of the stage $28_4$. A second three-input NOR gate 60 NORs the Q output signal (Q10) of the stage $26_6$ with the QN signals (Q9 and Q11) of the stages $28_5$ and $28_6$. An AND gate 62 logically ANDs the output signals of the NOR gates 58 and 60 to generate an output signal AZH (All Zero High). The signal AZL produced by the AND gate 62 rises to a logic high level when the output signals Q6, Q7, Q8, Q9, Q10 and Q11 are each at a logic low level.

The signals AZH and AZL produced by the AND gates 54 and 62 are ANDED by an AND gate 64 whose output is coupled to the first input of an OR 68. The gate 68 is that is supplied at its second input with an external Reset Counter signal (RSC) that is asserted to a logic high level to reset the counter 18. The RSC signal also serves as the signal PC that is applied to the clear/preset input of the counter stages $26_1$–$26_6$ and $28_1$–$28_6$. The output signal of the OR gate 68 serves as the carry bit CO on the output line 21 of the counter 18. When either the RSC signal is at a logic high level, or both the AZL and AZH signals are at a logic high level (as occurs when the counter count Q[0, 11] is all zeros), then the OR gate 68 generates a logic high level carry bit. The carry bit generated by the OR gate 68 also serves as the Parallel Load signal PL applied to the SD input of each of the counter stages $26_1$–$26_6$ and $28_1$–$28_6$.

During normal operation of the counter 18 of FIG. 2 in a count-down mode, the CI signal applied to the first counter stage $26_1$ of the chain 42 is at a high logic level. Thus, upon the first rising edge of the clock signal applied to the counter 18, the counter stage $26_1$ generates a logic low level signal at its output Q0 and a logic high level CO signal. With its CO output signal at a logic high level, the stage $26_1$ disables the counter stage $28_1$ from toggling upon the first rising edge of the counter clock signal. The QN signal of the stage $28_1$ remains at a logic high level because the signal CI to that stage is at a logic high level.

Upon the second rising edge of the clock signal, the stage $26_1$ toggles (i.e., its Q output signal transitions from a "0" to a "1", as seen in FIG. 6). Hence, the signal CO of the stage $26_1$ now falls to a logic low level, thus enabling the stage $28_1$ to toggle (i.e., its output signal transitions from "1" to "0" as seen in FIG. 7). Upon a third rising clock edge, the stage $26_1$ is enabled, generating its CO signal at a logic "high" level, thus again disabling the counter stage $28_1$. Thus, upon the third rising clock edge, only the counter stage $26_1$ toggles, causing its CO signal to fall to a logic low level. Thus, upon the fourth clock edge, the counter stage $28_1$ toggles, causing its QN signal to transition to a logic "1" as seen in FIG. 7.

Each of the down stream stages $26_2$–$26_6$ and $28_2$–$28_6$ are enabled by their upstream stage in a similar fashion to enable the counter 18 to count down from a initial value (say 111 . . . 1) to (000 . . . 0) to generate a monotonically decreasing count Q[0, n-1]. It should be understood that the counter 18 could easily be configured to count up from 000 . . . 0 to a prescribed value (say, 111 . . . 1) to generate a monotonically increasing count..

When the counter 18 is operating normally, (i.e., the signals DSC and RCC are at logic low levels), the signal CO output by the counter stage $28_3$ serves as the signal CI for the counter stage $26_4$. In this way, the counter stage $28_3$ sets the counter stage $26_4$, which, in turn, sets the counter stage $28_4$ and so on. Thus, under these circumstances, the counter 18 generate a twelve-bit monotonically decreasing count, as represented by the output signals Q0–Q11.

Now, consider when the signal RCC is asserted to a logic high level, as occurs when the counter 18 is to operate in its reconfigured mode during testing. While RCC is at a logic high level, the CI signal at the counter stage $26_4$ of the chain 44 remains at a logic high level, rather than rising to a logic high level when the stage $28_3$ is toggled. Thus, while the signal RCC remains at a logic high level, the counter stage $26_4$ toggles in unison with the stage $26_1$ of the chain 42. Hence, the stages $26_4$, $28_4$, $26_5$, $28_5$, $26_6$, and $28_6$ will toggle in unison with the stages $26_1$, $28_1$, $26_2$, $28_2$, $26_3$, and $28_3$, respectively, provided the counter 18 is operating properly. Consequently, the count represented by the output signals Q0–Q5 of the counter stages $26_1$, $28_1$, $26_2$, $28_2$, $26_3$, and $28_3$, respectively, should equal the count represented by output signals Q6–Q11 of the counter stages $26_4$, $28_4$, $26_5$, $28_5$, $26_6$, and $28_6$, respectively, when the counter 18 is operating properly.

While the counter 18 is operating in the reconfigured mode, the count represented by the output signals QN0–QN5 of the chain 42 corresponds to the low half-count $QN_L$ while the count represented by the output signals QN6–QN11 of the chain 44 corresponds to the high half-count $QN_H$. Both the chains 42 and 44 of counter stages count in unison, either until the DSC signal goes high, or until the chains are reloaded. When the counter 18 is operating in its non-reconfigured mode, the counter 18 still generates the half-counts $QN_L$ and $QN_H$ (corresponding to the lower and upper order bits, respectively of the count Q[0, 11]. However, when the counter is operating in its normal (non-reconfigured) mode, the half-counts are usually not equal to each other.

Figure 5:
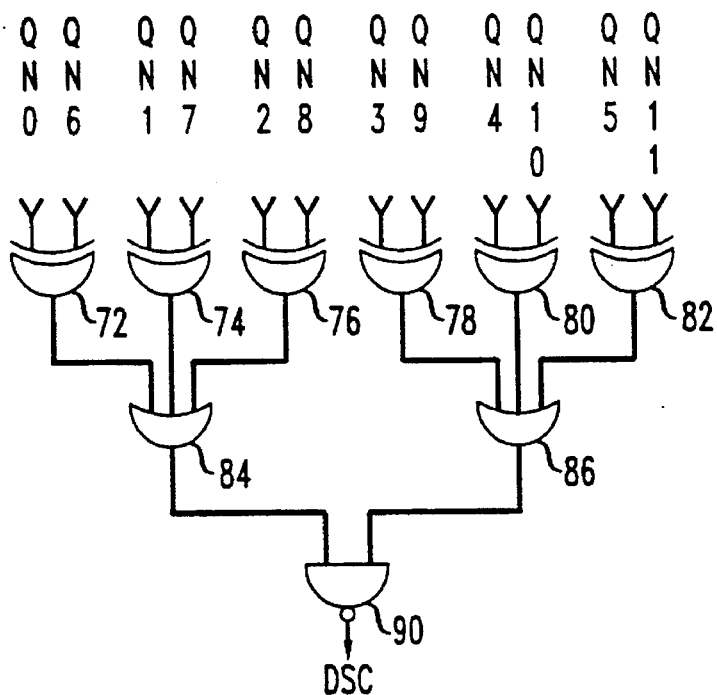
FIG. 5 is a block schematic diagram of a logical equality comparator that is utilized to test the counter of FIG. 1.

Referring to FIG. 1, testing of the counter 18, in accordance with the invention, is accomplished with the aid of a logical equality comparator 70 whose details are shown in FIG. 5. The comparator 70 of FIG. 5 comprises six exclusive OR (XOR) gates 72, 74, 76, 78, 80 and 82, each serving to exclusively OR one of the bits of the half-count $QN_L$ (i.e., one of the output signals QN0–Q5) to a corresponding one of the bits of the half-count $QN_H$ (i.e., one of the output signals QN6–QN11). Thus, for example, the XOR gate 72 exclusively ORs the output signal QN0 of the stage $26_1$ of FIG. 2 with the output signal QN6 produced by the stage $26_4$ of FIG. 2. In a similar manner, the XOR gate 74 of FIG. 5 exclusively OR's the output signal QN1 produced by the stage $28_1$ of FIG. 2 with the signal QN7 produced by the stage $28_4$. A NOR gate 84 NORs the output signals of the XOR gates 72, 74, and 76 while a second NOR gate 86 NORs the output signal of the XOR gates 78, 80 and 82. A NAND gate 90 logically NANDs the output signals of the NOR gates 84 and 86, yielding an output signal that serves as the DSC signal supplied to the AND gate 48 and the OR gate 51, both of FIG. 2.

As may be appreciated, the output signal DSC of the NAND gate 90 remains at a logic low level only while both of the inputs of each of the NOR gates 84 and 86 remain at the same logic level. This occurs only when the half-count $QN_L$ (comprising the output signals QN0–QN5) corresponds identically to the half-count $QN_H$ (comprising the output signals QN6–QN11). If the half-count $QN_L$ differs from the half-count $QN_H$, as occurs when any of the output signals QN0–QN5 differs from a corresponding one of the output signals QN6–QN11, respectively, then the output signal DSC of the NAND gate 90 rises to a logic high level.

To test the counter 18, the load value PI[0, 11] is loaded into the counter. Thereafter, the counter 18 is clocked while the signals RCC and RST are each held at a logic low level. If the counter carry bit CO does not toggle, then the counter 18 is defective, and there is no need for any further testing.

Assuming that the counter carry bit CO does toggle when the counter 18 is clocked, then it is necessary to verify the counter counts by the method of the invention. To that end, the counter 18 is first loaded from the register 12. Thereafter, the counter 18 is reconfigured by applying a continuously high logic level signal RCC. With the signal RCC at a logic high level, the counter 18 reconfigures itself and generates the half-counts $QN_L$ and $QN_H$ upon each rising edge of the clock signal. The counter also generates its count Q[0, 11] which may be used for other purposes.) Next, the counter 18 is reset by applying temporarily a logic high level reset RSC to the counter at its reset input RSC, so the counter counts from the loaded value.

The logical equality comparator 70 of FIG. 1 compares each successive half-count $QN_L$ to each successive half-count $QN_H$. As long as each successive half-count $QN_L$ equals $QN_H$, the output signal DSC of the comparator 70 remains at a logic low level. While the signal DSC remains a logic low level, the counter 18 remains enabled, and continues counting until such time as the counter counts down to zero. Once the counter 18 has counted down to zero, then, upon the next rising edge of the clock signal, the counter produces a logic high level carry bit CO on the line 21 as described. If the counter 18 is reloaded, then the counter will down count again in the manner described and generate a subsequent carry bit. Thus, while the counter 18 is operating properly, the counter periodically will generates a logic high carry bit on the line 21.

Should any successive half-count $QN_L$ be unequal to the corresponding half-count $QN_H$ during the test mode, the comparator 70 will produce a logic high level signal DSC at its output. If the signal DSC becomes high while the signal RCC is at a logic high level, then the counter stages $26_1$ and $26_4$ will no longer each be supplied with a logic high level signal CI, thus disabling the counter 18. Consequently, the counter 18 ceases counting and remains at the faulty count until the counter is reset. Thus, the counter 18, when faulty, will not complete a counting cycle and will not generate a logic high carry bit. Accordingly, a faulty counter can be detected by monitoring the carry bit during the testing mode.

Depending on the nature of the testing that its desired, the above-described process can be repeated for the same or different load values. For example, the counter 18 may have more than one fault. Under such circumstances, it may be desirable to locate each fault, rather than just one. To locate each fault, the counter 18 is tested by loading in a first initial value PI[0, n-1] and then clocking the counter to count down. Assuming that the first fault is found at a counter count of Q[0, n-i], where i is an integer greater than 1, then to find the next fault, the counter 18 is loaded with an initial value of PI[0, n-i-1] and the testing process is initiated again until the next fault is found. Each fault can be found by reloading the counter 18 with an initial value below the last fault and then clocking the counter to count down as before. As may be appreciated, this process is equally suited for an up counter, except that each subsequent fault will be detected by loading the counter with an initial value that is at least one greater than the last fault value.

When n is even, a faulty counter 18 can be detected by comparing each successive counter half-count $Q_L$ to each corresponding half-count $Q_H$. However, when n is odd, the counter 18 may still be faulty error even when the half-counts are equal. When n is odd, the counter will generate the two half counts $Q_L$ and $Q_H$ as well as a remainder bit (not shown). The remainder bit, for example, corresponds to the lowest order bit of the full count Q[0, n-1]. When the half-counts are compared to each other, the remainder bits goes unchecked. It is possible for the half-counts to equal each other, but remainder bit may remain fixed when the counter 18 is faulty. Thus, when n is odd, it is desirable to check to see whether the remainder bit not comprising either of the half-counts toggles upon each rising edge of a clock signal, in addition to comparing the half-counts to each other.

The foregoing discloses a technique for testing a long counter 18 by reconfiguring the counter to generate separate but equal half-counts and then comparing the half-counts to one another. While the counter 18 has been described as counting down to zero from the initially loaded n-bit data word P[0, n-1], the counter could easily be chosen to up from zero to this value.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for testing a n-bit counter (where n is an integer$\geq 1$) that provides an n-bit count that runs between zero and an initial count value$\leq 2^n$-1, and the counter being reconfigurable to provide first and second half-counts that are equal to each other when the counter is operating properly, the method comprising the steps of:

(a) resetting the counter and thereafter loading the counter with the initial count value;

(b) reconfiguring the counter to generate the first and second half-counts;

(c) comparing the first half-count to the second half-count and successively clocking the counter to change the first and second counts;

(d) inhibiting the counter from counting if a successive half-count is unequal to the other half-count; and (e) checking whether the counter has completed counting.

2. The method according to claim 1 wherein the steps (a)–(e) are repeated for each of a plurality of initial count values successively loaded in the counter.

3. The method according to claim 1 wherein the counter is successively loaded with different initial values being chosen in accordance with the value of each successive half-count when that half-count is unequal to the other.

4. The method according to claim 1 wherein the counter counts down from the initial value to zero.

5. A method for testing a n-bit counter (where n is an integer$\geq 1$) that provides an n-bit count that runs between zero and an initial count value$\leq 2^n$-1, and a carry bit when the counter has counted out, and the counter being reconfigurable to provide first and second half-counts that are equal to each other when the counter is operating properly, the method comprising the steps of:

(a) resetting the counter and thereafter loading the counter with the initial count value;

(b) clocking the counter to cause it to generate its count;

(c) repeating steps (a) and (b) while checking if the counter has counted out and if so, then (d) reconfiguring the counter to generate the first and second half-counts;

(e) resetting the counter and loading the counter with the initial value;

(f) comparing the first half-count to the second half-count and successively clocking the counter to change the first and second counts;

(g) inhibiting the counter from counting if a successive half-count is unequal to the other half-count; and (h) checking whether the counter has generated a carry bit at a prescribed logic level.

6. A test apparatus for testing a n-bit counter (where n is an integer$\geq 1$) that provides a count that runs between zero and an initial count value$\leq 2^n$-1, and the counter being reconfigurable in response to an externally generated signal at a prescribed logic level to provide first and second half-counts, the apparatus comprising:

a logical equality comparator for comparing the first and second half-counts and for generating a signal at said prescribed logic level when one half-count is unequal to the other to inhibit the counter from counting.

* * * * *